United States Patent [19]
Lin

[11] Patent Number: 5,704,667
[45] Date of Patent: Jan. 6, 1998

[54] HIGH-STRENGTH TRANSPORT SUPPORTING FRAME

[75] Inventor: Yu-Tsai Lin, Miaoli, Taiwan

[73] Assignee: United Microelectronics Corporation, Taiwan

[21] Appl. No.: 728,053

[22] Filed: Oct. 9, 1996

[30] Foreign Application Priority Data

Jul. 22, 1996 [TW] Taiwan ............... 85211102

[51] Int. Cl.$^6$ .................................. B65D 25/28
[52] U.S. Cl. ............... 294/15; 294/27.1; 294/168
[58] Field of Search ................... 294/15, 16, 27.1, 294/28, 33, 144, 168, 172; 16/114 R; 118/500, 503, 728; 206/454, 710, 711; 211/41; 220/752, 759

[56] References Cited

U.S. PATENT DOCUMENTS

| | | | |
|---|---|---|---|
| 927,309 | 7/1909 | Witney | 294/15 |
| 2,515,826 | 7/1950 | Hall | 294/168 X |
| 2,679,736 | 6/1954 | Duchin | 294/172 X |
| 2,739,007 | 3/1956 | Rauterberg | 294/15 |
| 4,423,898 | 1/1984 | Spor | 294/15 X |
| 5,110,001 | 5/1992 | Dunn | 294/33 |

Primary Examiner—Johnny D. Cherry
Attorney, Agent, or Firm—Rabin, Champagne & Lynt, P.C.

[57] ABSTRACT

A high-strength transportation frame for carrying wafer boats between processing stations in a semiconductor fabrication facility includes a pair of transporting rods each having a corresponding grip portion, a number of fixing elements, and a pair of connecting rods. The connecting rods extend parallel to each other and are connected to each of the pair of transporting rods at remote ends thereof, the connections being secured by the fixing elements.

7 Claims, 2 Drawing Sheets

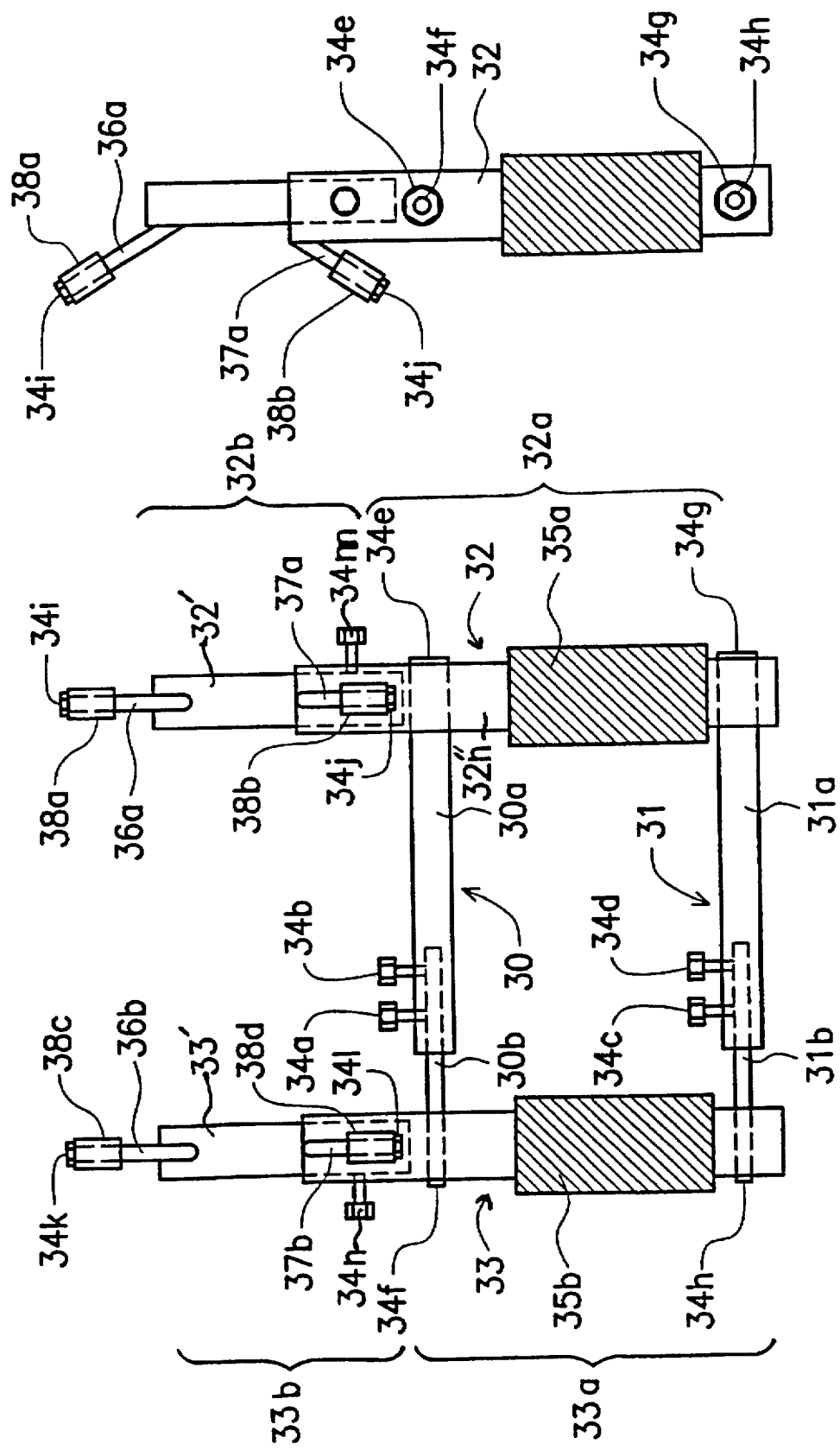

HIGH-STRENGTH TRANSPORT SUPPORTING FRAME

BACKGROUND OF THE INVENTION

1. Field of the Invention

The invention relates in general to a transport supporting frame for a semiconductor wafer boat carrying semiconductor wafers when being transported between processing stations during semiconductor circuit fabrication. In particular, the invention relates to a high-strength transport supporting frame for semiconductor wafer boats used for transporting wafers into and out of horizontal furnace systems.

2. Technical Background

Diffusion processing is a common semiconductor fabrication technique widely employed, for example, for the formation of p- and n-type regions in a device substrate during integrated circuit fabrication. Thermal diffusion equipment commonly used for such processing can be categorized as horizontal and vertical types. Among the two types, the horizontal type for use with horizontal heating furnaces was the one first developed and is still in use today. When handling wafers during such diffusion processing, which inevitably involves relatively high temperatures, especially when the processed wafer is to be retrieved from inside the furnace, a wafer carrier, also known as a wafer boat, capable of withstanding high temperature must be used to carry the diffusion-processed wafers. These wafer boats are carriers made of annealed quartz.

One of the commonly-used diffusion furnaces is the "Atmoscan" horizontal furnace system manufactured by Atmoscan Corporation. A conventional wafer boat transport supporting frame structure for use with such a furnace is depicted in FIGS. 1 and 2. FIG. 1 is a top view of the conventional wafer boat transport supporting frame, while FIG. 2 is a side elevational view of the frame.

As is seen in the drawings, the conventional wafer boat transport supporting frame is made up of a connecting rod 11 fixedly connecting a pair of transporting rods 10a and 10b in a generally H-shaped configuration. The connecting rod 11 consists of a pair of rods, in particular, a large-diameter and a small-diameter rod, 11a and 11b respectively. As is shown in the drawing, the fight end of the small-diameter rod 11b is inserted into the left end central tubular space of the large-diameter rod 11a, and secured by a pair of screws 18 and 19. Further, the left end of the small-diameter rod 11b is fixedly attached to transporting rod 10b, while the right end of the large-diameter rod 11a is fixedly attached to transporting rod 10a. Respective connections of the large- and small-diameter rods 11a and 11b are implemented at about the centers of the transporting rods 10a and 10b.

Transporting rod 10a includes a grip portion 13 and two support rods 16a and 17a as illustrated in FIG. 1. An upper end of support rod 16a and the lower end of support rod 17a are covered by insertion into sleeves 16b and 17b, respectively. In a similar manner, transporting rod 10b includes a grip portion 12 and two support rods 14a and 15a. An upper end of support rod 14a and the lower end of support rod 15a are covered by insertion into sleeves 14b and 15b, respectively. The surfaces of the grip portions 12 and 13 have patterns carved therein to assist in manually gripping the frame when used by an operator to transport a wafer boat.

When such a prior art wafer boat transport supporting frame as described above is used for carrying a wafer boat, it is frequently difficult to control the balance of the two rods 10a and 10b when an operator grips the grip portions 12 and 13. This is because the connecting rod 11 is connected to each of the two transporting rods 10a and 10b at its two respective ends at only one point. Excessive deviation from a parallel alignment between the two rods 10a and 10b, due to unbalanced force being applied by the operator via the grip portions 12 and 13, for example, frequently results in the capsizing of the wafer boat being transported, with consequential damage to the wafers being transported.

SUMMARY OF THE INVENTION

It is therefore an object of the invention to provide a high-strength wafer boat transport supporting frame for carrying wafers in a wafer boat when being transported between processing stations during the fabrication process.

It is another object of the invention to provide a high-strength transport supporting free for a semiconductor wafer boat for transporting wafers into and out of horizontal furnace systems.

The invention achieves the above and other objects by providing a high-strength transport supporting frame for carrying a wafer boat between processing stations at a semiconductor fabrication facility. The structure includes a pair of transporting rods, each rod having a respective grip portion, a pair of connecting rods and a number of fixing means for securing the transporting rods to the connecting rods. The connecting rods extend parallel to each other and are connected at ends thereof to the pair of transporting rods, the connection being secured by the fixing means.

BRIEF DESCRIPTION OF THE DRAWINGS

Other objects, features, and advantages of the invention will become apparent by way of the following detailed description of the exemplary preferred but non-limiting embodiment. The description is made with reference to the accompanied drawings in which:

FIG. 3 is a top view of a wafer boat transport supporting frame constructed in accordance with a preferred embodiment of the invention; and FIG. 4 is a side elevational view of a wafer boat transport supporting frame of FIG. 3.

DETAILED DESCRIPTION OF THE PREFERRED EMBODIMENT

Figure 2:
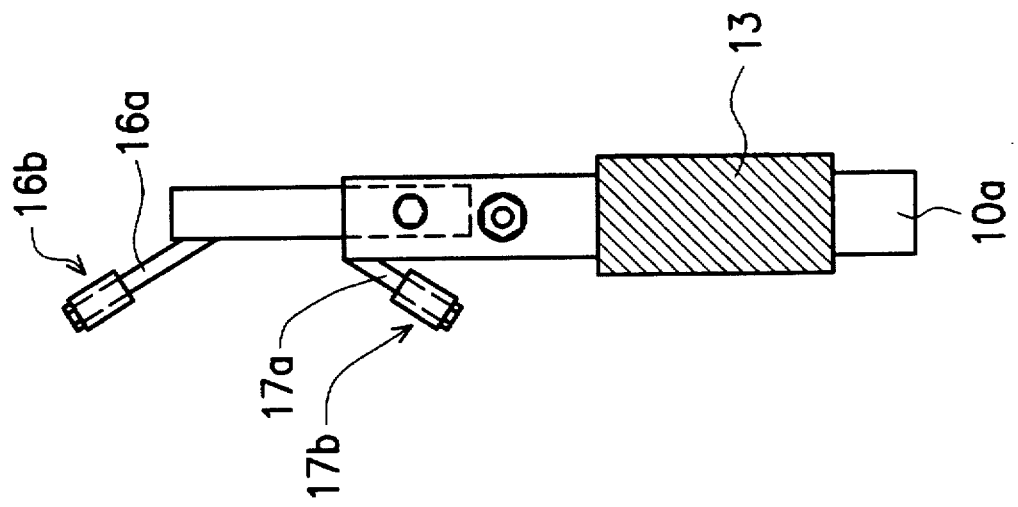
FIG. 2 is a side elevational view of the wafer boat transport supporting frame of FIG. 1.
Figure 1:
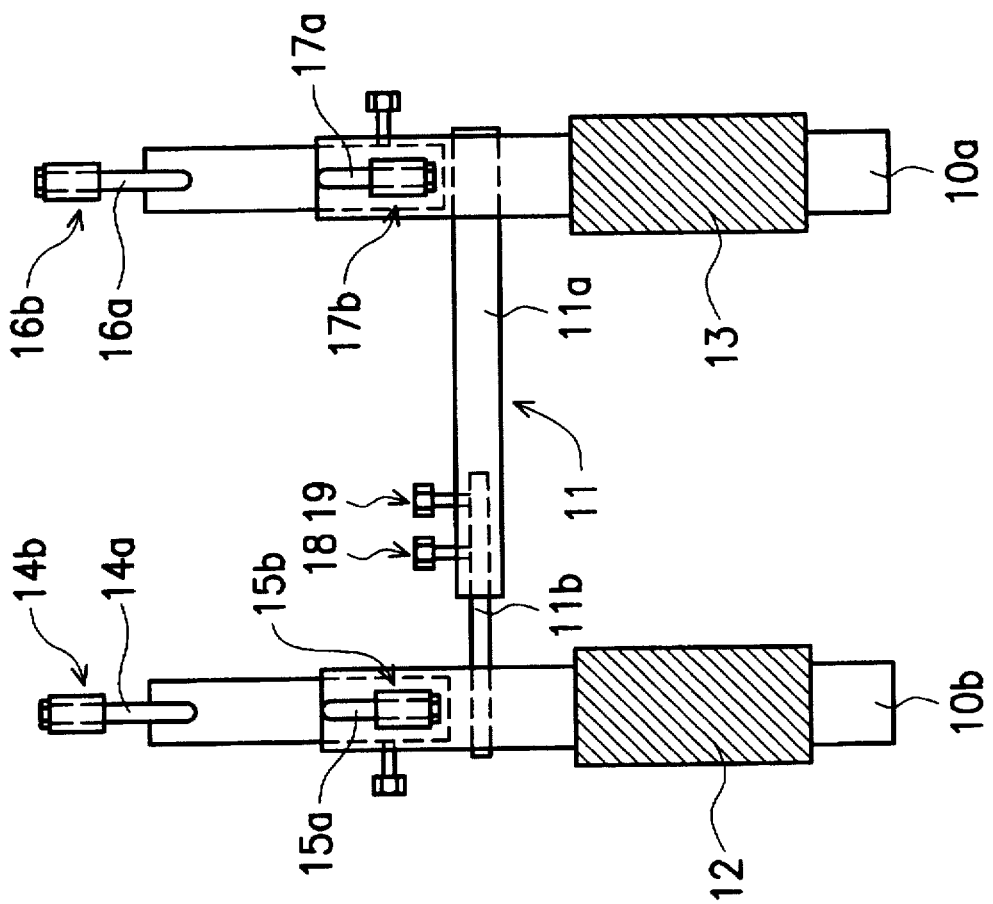
FIG. 1 is a top view of a conventional wafer boat transport supporting frame thereof.

For a description of the exemplary preferred embodiment of the invention, reference is now made to the high-strength wafer boat transport supporting frame depicted in FIGS. 3 and 4. FIG. 3 is a top view of the wafer boat transport supporting frame constructed in accordance with the preferred embodiment of the invention, while FIG. 4 is a side elevational view of thereof.

As is seen in the drawing; the high-strength wafer boat transport supporting frame comprises a pair of connecting rods 30 and 31, and a pair of essentially parallel transporting rods 32 and 33. Each transporting rod 32, 33 is composed of first longitudinally extending regions 32a, 33a, and second longitudinally extending regions 32b, 33b. The connecting rods 30 and 31 serve to fix the two transporting rods 32 and 33 firmly in place to form a sturdy structural configuration. Connecting rods 30 and 31 extend parallel to each other, and each includes a larger-diameter rod and a smaller-diameter rod, i.e., 30a and 31a, as well as 30b and 31b, respectively.

For each of the connecting rods 30 and 31, the larger- and smaller-diameter rods are connected together by a pair of securing means, i.e., 34a and 34b, as well as 34c and 34d. As may well be appreciated, securing means 34a, 34b, 34c and 34d may, for example, be screws such as those used in the described conventional transport supporting frame structure. In the illustrated exemplary embodiment, one end of the smaller-diameter rod may be inserted into the central tubular space of the opposite end of the larger-diameter rod, and then secured by the securing means. Such an arrangement allows for an adjustment to the length of the connecting rods 30 and 31 to accommodate wafer boats of various different sizes.

Similarly, each transporting rod 32 and 33 includes an inner member 32', 33', and an outer member 32", 33". Each inner member 32', 33' is adjustably inserted into the respective outer member 32", 33". Likewise, the inner members 32', 33' are secured to the outer members 32", 33" using securing device 34m, 34n. This arrangement allows the length of the transporting rods to be adjusted.

The remote ends of the connecting rods 30 and 31 are connected to the first regions 32a, 33a of the transporting rods 32 and 33 by appropriate means in a fixed manner. For example, the remote end of the larger-diameter connecting rod 30a may be fixed to the transporting rod 32 at point 34e, which is about half way along the length of the rod 32, while the remote end of the smaller-diameter connecting rod 30b may be fixed to the transporting rod 33 at point 34f, which is about half way along the length of rod 33. In a similar manner, the remote end of the larger-diameter connecting rod 31a may be fixed to the transporting rod 32 at point 34g, which is about at the end proximate an operator, while the remote end of the smaller-diameter connecting rod 31b may be fixed to the transporting rod 33 at point 34h, which is about at the end proximate to the operator. Therefore, the remote ends of the connecting rods 30 and 31 where they are fixedly attached to the transporting rods 32 and 33 are fitted with appropriate fixing means, such as screws, i.e., at points 34e, 34f, 34g and 34h, for implementing the fixed attachment.

First region 32a of transporting rod 32 includes a grip portion 35a, and second region 32b includes two support rods 36a and 37a, as illustrated in both FIGS. 3 and 4. The upper end of support rod 36a and the lower end of support rod 37a are covered by insertion into sleeves 38a and 38b, respectively. In a similar manner, first region 33a of transporting rod 33 includes a grip portion 35b, and second region 33b includes two support rods 36b and 37b, the upper end of support rod 36b and the lower end of support rod 37b being covered by insertion into sleeves 38c and 38d, respectively. On the surface of the grip portions 35a and 35b, patterns are carved to assist in manual gripping. Sleeves 38a, 38b, 38c and 38d are made of a material suitable for carrying a wafer boat, such as VESPEL (polyimide resin). These sleeves can be fixed to their respective support rods 36a, 37a, 36b and 37b by fixing means 34i, 34j, 34k and 34l, respectively. As a person skilled in the art may well appreciate, these fixing means 34i, 34j, 34k and 34l may be, for example, screws or any other suitable fixing means.

Thus, with the incorporation of an additional connecting rod 31 as compared to the conventional wafer boat transportation frame, the invention is capable of exhibiting better strength characteristics when operated for transporting a wafer boat into and out of a horizontal furnace system, such as the Atmoscan furnace mentioned above. Due to the presence of the additional connecting rod 31 in the first region 32a, 33a, even when the operator applies unbalanced forces to the frame with the grip portions 35a and 35b, the frame will not easily twist putting the transporting rods 32 and 33 out of parallel with respect to each other. In this way, a wafer boat carded on the surface of the sleeves 38a, 38b, 38c and 38d will not be easily tipped over, thereby avoiding an undesirable mishandling of the wafers. Therefore, in accordance with the invention, by providing a structural enhancement to the conventional wafer boat transport supporting frame that is simple and low in cost, the effectiveness of the frame for handling a wafer boat is greatly improved.

Thus, while the invention has been described by way of an example and in terms of an exemplary preferred embodiment, it is to be understood that the invention is not necessarily limited thereto. To the contrary, the invention is intended to cover various modifications and similar arrangements. The scope of the appended claims should therefore be accorded the broadest possible interpretation so as to encompass all such modifications and similar arrangements.

What is claimed is:

1. A transport supporting frame for carrying a wafer boat, comprising:

a pair of essentially parallel transporting rods, each rod being composed of first and second contiguous, longitudinally extending regions, each first region having a respective grip surrounding a portion thereof;

a pair of connecting rods which extend parallel to each other and are connected at ends thereof to the respective first regions of the pair of transporting rods, with each respective grip being disposed between respective ends of the pair of connecting rods; and a pair of first and second support rods and respective sleeves, connected to the respective second regions of said transporting rods, the second regions being free of a direct connection together so that a wafer boat may be received and carried by said support rods and sleeves.

2. The transport supporting frame of claim 1, wherein the sleeves comprise a polyimide resin.

3. The transport supporting frame of claim 1, wherein each respective connecting rod comprises:

an inner rod and an outer hollow rod, the inner rod adjustably fitting inside the outer hollow rod, and screws which are disposed to extend through the outer hollow rod and secure the inner rod within the outer hollow rod.

4. The transport supporting frame of claim 1, wherein said transporting rods each comprise an inner and an outer member, the inner member being adjustably inserted into the outer member, and securing means for securing the respective inner member to the respective outer member, wherein the length of the respective transporting rods is adjustable by positioning the respective inner member with respect to the respective outer member.

5. The transport supporting frame of claim 1, wherein a first one of said pair of connecting rods is connected to the transporting rods at first ends of the transporting rods, and wherein a second one of said pair of connecting rods is connected to the transporting rods at mid regions of the transporting rods.

6. The transport supporting frame of claim 1, further comprising a plurality of fixing means for securing the connection of the transporting rods and connecting rods.

7. The transport supporting frame of claim 6, wherein the plurality of fixing means comprise screws.

* * * * *